United States Patent
Kobashi et al.

[11] Patent Number: 5,863,324
[45] Date of Patent: Jan. 26, 1999

[54] PROCESS FOR PRODUCING SINGLE CRYSTAL DIAMOND FILM

[75] Inventors: Koji Kobashi; Takeshi Tachibana, both of Kobe; Yoshihiro Shintani, Tokushima, all of Japan

[73] Assignee: Kabushiki Kaisha Kobe Seiko Sho, Kobe, Japan

[21] Appl. No.: 678,683

[22] Filed: Jul. 11, 1996

[30] Foreign Application Priority Data

Aug. 4, 1995 [JP] Japan .................................... 7-219625

[51] Int. Cl.⁶ .................................................. C30B 29/04
[52] U.S. Cl. ............................... 117/89; 117/95; 117/929
[58] Field of Search ............................. 117/929, 89, 95

[56] References Cited

U.S. PATENT DOCUMENTS 5,397,428  3/1995  Stoner et al. .......................... 117/929

FOREIGN PATENT DOCUMENTS

| 0 322 812 | 7/1989 | European Pat. Off. . |
| 0 440 384 | 8/1991 | European Pat. Off. . |
| 0 492 159 | 7/1992 | European Pat. Off. . |
| 195 43 723 | 5/1996 | Germany . |
| 02-97485 | 4/1990 | Japan ...................................... 17/929 |
| 03-115193 | 5/1991 | Japan ..................................... 117/929 |
| 2 295 402 | 5/1996 | United Kingdom . |

OTHER PUBLICATIONS

Patent Abstracts of Japan, vol. 18, No. 664 (C–1288)(7004), p. 68 & JP 6–263593 A.

*Primary Examiner*—Robert Kunemund
*Attorney, Agent, or Firm*—Oblon, Spivak, McClelland, Maier & Neustadt, P.C.

[57] ABSTRACT

Provided is a process for economically producing single crystal diamond film with a large surface area by gas-phase synthesis. The process comprises depositing platinum film or platinum alloy film containing more than 50 atomic % of platinum on a basal substrate with (111) or (001) surface while keeping the substrate temperature at 300° C. or above, annealing the platinum or platinum alloy film at 1000° C. or above, and performing the gas-phase synthesis of diamond using said platinum or platinum alloy film as the substrate.

14 Claims, 7 Drawing Sheets

PROCESS FOR PRODUCING SINGLE CRYSTAL DIAMOND FILM

BACKGROUND OF THE INVENTION

1. Field of the Invention

The present invention relates to a process for producing single crystal diamond film which is suitable for use in electronic devices (such as transistors, diodes, and sensors), heat-sinks, surface acoustic wave devices, X-ray windows, optical materials, antiwear materials, decorative materials, and other coating materials.

2. Description of the Prior Art

Diamond is characterized by its outstanding heat resistance and large band gap (5.5 eV). It is usually an insulator, but can be semiconducting by doping with impurities. Diamond also has good electrical properties, such as a high breakdown voltage, a high saturated drift velocity, and a low dielectric constant. Because of these electrical characteristics diamond is considered to be an excellent material for use in electronic devices and sensors to be used at high temperatures., high frequencies, and high electric fields.

So far, studies have been conducted on the use of diamond in photosensors and light-emitting elements for light in the short-wave length region (such as ultraviolet) based on the large band gap, in heat sinks based on the high thermal conductivity and low specific heat, in surface acoustic wave devices based on the extremely high hardness, and in X-ray windows and optical materials based on the high transmittance and refractive index. Furthermore, diamond has been widely used as an antiwear material for cutting tools.

In order to fully exploit the characteristics of diamond in various fields, it is necessary to synthesize high quality single crystal diamond with low structural defects. Moreover, for practical use, it is necessary to develop processes for depositing single crystal diamond films on large areas at low cost. At present, single crystal diamond is obtained by natural mining or synthesis under high pressure—high temperature conditions. However, such single crystal diamond, which will be referred to as bulk diamond, has only a limited crystal surface area of about 1 cm$^2$ at the largest. Moreover, it is extremely expensive. Therefore, its industrial use is limited only to specific areas, such as abrasives and high precision cutting tools.

It is well known that polycrystalline diamond films can be synthesized from gas phase by microwave chemical vapor deposition (CVD) (Japanese Laid-Open Patent Application Nos. 27754/1984 and 3320/1986), high-frequency plasma CVD, hot filament CVD, DC plasma CVD, plasma jet method, combustion, or hot filament CVD. These methods permit the economical production of diamond film of a large area.

However, diamond films grown on non-diamond substrates such as silicon are polycrystalline where diamond particles randomly aggregate, and as shown in the electron micrograph of FIG. 5, a large number of grain boundaries are contained in the film. Recently, it has been reported that highly oriented diamond films, where diamond crystal grains are oriented in almost the same orientation, as shown in FIG. 6, can be synthesized. However, the film is also polycrystalline, and still contains a large number of grain boundaries. Since grain boundaries trap and scatter carriers (electrons and holes) moving through diamond, even the highly oriented diamond film is inferior in electrical properties to bulk diamond with few grain boundaries. Consequently polycrystalline and highly oriented diamond films do not exhibit satisfactory performance for practical electronic devices and sensors.

Likewise, the existence of grain boundaries is disadvantageous for optical applications because of light scattering and low transmittance. In applications for cutting tools, polycrystalline diamond films are liable to chip.

When single crystal bulk diamond or cubic boron nitride is used as the substrate in the gas-phase synthesis, single crystal diamond films can be grown. However, its surface area is limited as mentioned hereinabove.

It is known that diamond films with a certain degree of grain orientation can be synthesized if nickel and copper are used as the substrate. However, nickel becomes brittle in the high temperature hydrogen plasma atmosphere for the gas-phase synthesis of diamond, and reacts with diamond formed thereon, thereby converting diamond into graphite (D. N. Belton and S. J. Schmeig, J. Appl. Phys., Vol. 66, p.4223 (1989)). On the other hand, copper has a linear thermal expansion coefficient which is more than 10 times greater than that of diamond at temperatures above 600° C., so that the diamond film formed on copper substrate is liable to be peeled off after cooling down to room temperature (D. F. Denatale et al., J. Materials Science, Vol. 27, p. 553 (1992)).

Gas-phase synthesis of diamond on platinum and other transition metals have been studied. However, only polycrystalline diamond films were grown (Matsumoto and Takamatsu, "Hyomen Gijutsu", Vol. 44, No. 10, p. 47 (1993); M. Kawarada et al., Diamond and Related Materials, Vol. 2, p. 1083 (1993); D. N. Belton and S. J. Schmeig, J. Appl. Phys., Vol. 69, No. 5, p.3032 (1991); D. N. Belton and S. J. Schmeig, Surface Science, Vol. 223, p. 131 (1990); and Y. G. Ralchenko et al., Diamond and Related Materials, Vol. 2, p. 904 (1993)).

For industrial use of diamond films, it is necessary to develop a process for synthesizing single crystal diamond films, which is completely or almost completely free of grain boundaries, on a large area. Such a process has not been available so far.

SUMMARY OF THE INVENTION

The present invention was completed in view of the foregoing. It is an object of the present invention to provide a process for economically producing single crystal diamond films with a large surface area by gas-phase synthesis in order to achieve a marked improvement of diamond film characteristics for a broad range of industrial applications.

According to the present invention, a single crystal diamond film is formed by a process, comprising the deposition of platinum or platinum alloys, containing more than 50 atomic % of platinum on a basal substrate, the annealing of the platinum or platinum alloy film, and the deposition of diamond film by gas-phase synthesis on the platinum or platinum alloy-coated substrate (hereinafter referred to as substrate).

The process of the present invention may include a scratching of the annealed platinum or platinum alloy film surface by buffing with diamond powder or paste, or by ultrasonic treatment prior to the gas-phase synthesis of diamond film.

The basal substrate may be any material having (111) or (001) surface, selected from lithium fluoride, calcium fluoride, magnesium oxide, nickel oxide, zirconium oxide, aluminum oxide, strontium titanate, barium titanate, lead titanate, potassium tantalate, and lithium niobate. The substrate may also be silicon, quartz, or glass.

The deposited platinum or platinum alloy film is oriented along the (111) or (001) crystal plane with respect to the basal substrate surface, and may be microcrystals or polycrystals.

It is preferable that the deposition of platinum or platinum alloy film is carried out at a substrate temperature of above 300° C., and the annealing is carried out at 1000° C. or above in an oxidizing atmosphere. The platinum alloy should preferably contain at least one element from groups 6A, 7A, 8A, and 1B of the periodic table.

By biasing the substrate prior to the gas-phase synthesis of diamond film, it is possible to form diamond nuclei on the substrate.

DETAILED DESCRIPTION OF THE INVENTION

To address the above-mentioned problem, the present inventors have carried out a series of experiments in which it was found that it is possible to form a single crystal or nearly single crystal diamond film by gas-phase synthesis on platinum or platinum alloy film, containing more than 50 atomic % of platinum, which has been deposited on a specific substrate, if the platinum or platinum alloy film is annealed at high temperatures after deposition, or the film is deposited at high temperatures, or the film is deposited at high temperature and then annealed at high temperatures.

Figure 7:
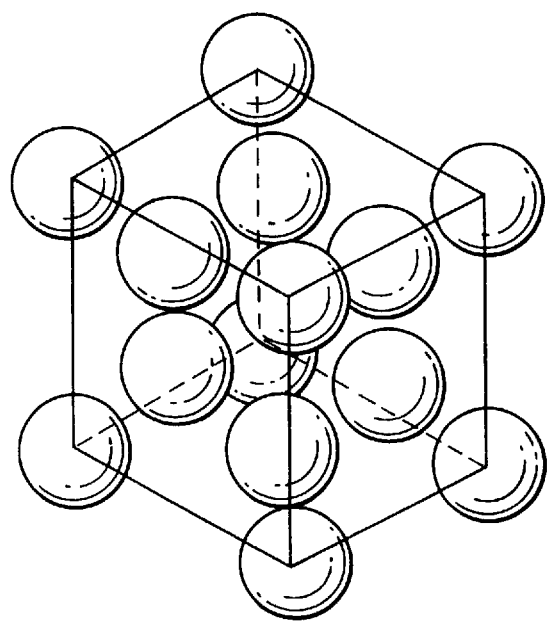
FIG. 7 is a schematic diagram showing the crystalline structure of platinum (face-centered cubic structure).
Figure 8:
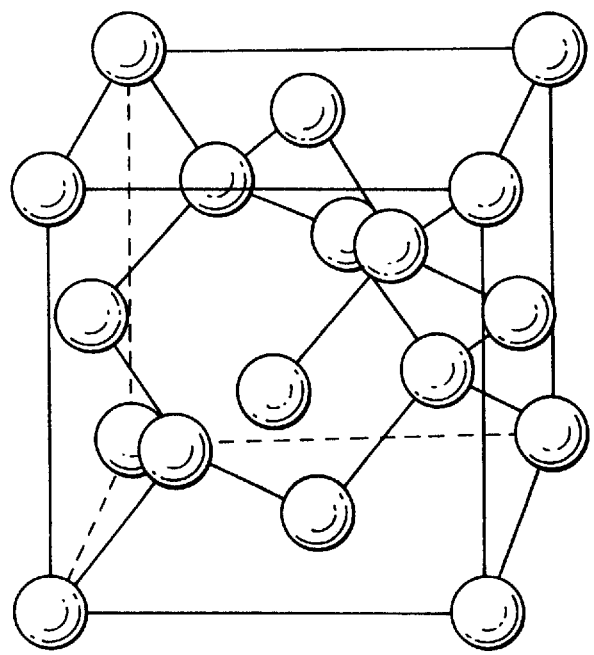
FIG. 8 is a schematic diagram showing the crystalline structure of diamond (diamond structure).

Based on the conventional theory on the growth of single crystal film, it is impossible to predict that single crystal diamond film can grow on platinum substrate. The first reason is that the lattice constant of platinum (3.9231Å) differs from that of diamond (3.5667Å) by as much as 10%. It is usually impossible to grow a single crystal material on a lattice constants substrate in which differ significantly. The second reason is that platinum and diamond have different crystal structures. Namely, platinum has a face-centered cubic structure, as shown in FIG. 7, whereas diamond has a diamond structure, as shown in FIG. 8. The difference in crystal structures prevents a continuous growth of a single crystal diamond film from the substrate. In fact, the conventional technology of producing diamond by CVD on platinum foil as the substrate merely results in a polycrystalline diamond film, consisting of randomly oriented diamond particles.

A possible mechanism for growing a single crystal diamond film on the surface of platinum or platinum alloy film according to the present invention is considered to be the following: Platinum is known to have a catalytic action, and hence readily decomposes carbon-containing molecules adsorbed on its surface. Therefore, a high concentration of chemically active carbon atoms are present on the surface of the substrate during the gas-phase synthesis of diamond. The carbon atoms react with platinum, and diffuse into the substrate bulk, resulting in a carbon supersaturation in the surface layer of platinum. This leads to the formation of diamond nuclei in platinum. Non-diamond nuclei, such as graphite, can also be generated, but readily disappear upon reaction with hydrogen or oxygen in the plasma. Since carbon is dissolved in platinum, the orientation of diamond nuclei is influenced by the crystal structure of platinum, and the surface irregularity (scratches) of the substrate have substantially no effect. Rather, the surface irregularity can promote the diffusion of carbon into platinum.

The reason why platinum is used s the substrate material is as follows: If nickel is used, diamond is converted to graphite due to its strong catalytic action. On the other hand, if copper is used, it does not dissolve carbon because of its weak catalytic action and weak chemical bond with carbon. In the case of silicon, which is widely used as the substrate for the gas-phase synthesis of diamond, the formation of diamond nuclei in silicon is prevented due to its strong covalent bond with carbon. By contract, platinum exhibits moderate catalytic action but weaker than nickel, so that it permits carbon to dissolve in platinum without a reaction. Therefore, platinum is the most appropriate material to be used as the substrate.

The use of platinum or platinum alloy film deposited on a specific substrate as a substrate makes possible the formation of single crystal diamond film of a large area. The present inventors have found that the above-mentioned results are obtained using not only platinum but also platinum alloys containing more than 50 atomic % of platinum. In the case that the platinum alloy contains less than 50 atomic % of platinum, the catalytic reaction becomes so weak that a single crystal diamond film is not formed. Thus, it is necessary that the content of platinum in the platinum alloys be more than 50 atomic % In order to utilize the characteristics of platinum, it is most preferable that the platinum content is higher than 99 atomic %.

As the secondary element, the platinum alloy may contain at least one element belonging to Group 6A (e.g. Cr, Mo, and W), Group 7A (e.g. Mn), Group 8 (e.g. Fe, Co, Ir, Ni, and Pd), and Group 1B (e.g. Au, Ag, and Cu) in the periodic table. The elements in Groups 6A and 7A form stable carbides, and the elements in Group 8A strongly react with carbon. On the other hand, the elements in Group 1B are inert to carbon. Therefore, by mixing the secondary elements in platinum, it is possible to control the reactivity of platinum and impart new chemical effects to the substrate. Moreover, since the lattice constant also can be controlled by mixing, the crystal orientation of single crystal diamond film with respect to the substrate. In the following, both platinum and platinum alloys containing more then 50 atomic % of platinum are referred to as platinum alloys.

Single crystal platinum alloys can be deposited by known processes such as sputtering and electron beam deposition, but sputtering is an easier method. There is not restriction on the thickness of the deposited platinum alloy films. In practice, however, there is a desired thickness, depending on the deposition process employed. For example, from the view point of film deposition, it is easier to control a thickness of greater than 0.1 $\mu$m. In order for the film to withstand the surface scratching treatment, a thickness greater than 0.5 μm is desirable. In order for the film to withstand deterioration due to etching by active hydrogen in the hydrogen plasma environment of diamond growth a thickness greater than 3 μm is desirable. In order for the film to withstand annealing in an atmospheric environment after the platinum alloy film deposition, a thickness of greater than 1 μm is necessary. On the other hand, the production cost will be too high if the thickness is too large. For these reasons, the practical thickness of the platinum alloy films should be in the range of between 0.1 and 30 μm, more preferably between 1 and 20 μm.

In general, (111) and (001) crystal planes of diamond appear more frequently than other planes in the gas-phase synthesis. Therefore, it is desirable that the deposited film of platinum alloys has either (111) or (001) crystal plane. If the surface of platinum alloy film is (111) oriented to a certain extent, a single crystal diamond film with (111) orientation grows. On the other hand, if the platinum alloy film surface is (001) oriented to a certain extent, a single crystal diamond film with (001) orientation can grow. The orientation of the crystal plane can be determined by X-ray diffraction.

It has been generally believed that in order to grow a single crystal film by gas-phase synthesis, the substrate itself must be a single crystal. However, according to the present invention, it is possible to form single crystal diamond film by gas-phase synthesis, if said platinum alloy film is deposited and annealed under said conditions, or if said platinum alloy film is deposited under said conditions, regardless of whether the deposited film is microcrystalline or polycrystalline. The reason for this is considered that the deposited platinum alloy film, oriented to some extent, permits diamond nuclei to spontaneously orient in the gas-phase synthesis.

It is preferable that the surface of the deposited platinum alloy film is entirely (111) or (001). However, it may also be an aggregation of either (111) or (001) crystal planes, if each domain has a surface area of greater than about 2500 μm$^2$, because an aggregate of single crystal diamond films grow epitaxially on the basal domains of platinum alloy films. Since the individual diamond films have a large surface area, the resulting diamond film has almost the same characteristics as bulk diamond.

The (111) or (001) crystal plane of platinum alloy film can be formed by sputtering or electron beam deposition on a substrate of any of the following compounds that has (111) or (001) crystal plane: Lithium fluoride, calcium fluoride, magnesium oxide, nickel oxide, zirconium oxide, aluminum oxide (sapphire), strontium titanate, barium titanate, lead titanate, potassium tantalate, and lithium niobate.

Although platinum alloy is expensive the production cost are not increased, because it can be peeled off from the single crystal diamond film for recovery. If the (111) or (001) oriented film of platinum alloy is deposited on a substrate such as silicon wafer, quartz, or glass, with or without surface modification, with or without an additionally deposited film, the production cost of single crystal diamond film can be reduced. In the cases described so far, it is desirable that the platinum alloy film is deposited on the entire surface of the base substrate. However, deposition onto a partial area is also acceptable, depending on the area and the purpose.

The annealing of the platinum alloy film may be conducted in vacuum or in an oxidizing atmosphere such as air. The present inventors found that single crystal diamond films can grow more readily, if annealing is done in an oxidizing atmosphere. This is presumably because oxygen adsorbed onto the platinum alloy surface helps grow a single crystal diamond film. By contrast, prolonged annealing in a reducing atmosphere is not desirable because this deteriorates the platinum alloy.

It can be assumed that single crystal diamond may grow on a single crystal surface of the substrate. However, it is impossible to predict whether single crystal diamond can grow on a scratched substrate surface, as seen in the present invention. According to the present invention, various methods of pretreating the platinum alloy substrate can be used to enhance the nucleation of diamond, such as biasing the substrate in a plasma containing carbon, and scratching the substrate surface by buffing with diamond powder or paste, and scratching by ultrasonic treatment. As described hereinabove, the scratches on the substrate surface promote the diffusion of carbon into the substrate.

Usually, nitrogen, oxygen and water in air are chemically or physically adsorbed onto the surface of the platinum alloy substrate. Since these adsorbed molecules prevent the growth of single crystal diamond films, it is necessary to clean the substrate surface prior to diamond deposition, by rinsing it in inorganic solvents, such as aqua regia and organic solvents, followed by letting the substrate stand at above 300° C. for more than 15 minutes in a high vacuum ($10^{-6}$ Torr or higher) to remove the adsorbed gas molecules, and by treating it in carbon-containing plasma generated from at least one kind of gas selected from hydrogen, oxygen, chlorine, and fluorine, or at least one kind of gas selected from helium, neon, and argon, or both.

The purpose of the treatment in carbon-containing plasma is to absorb carbon in the substrate surface to facilitate supersaturation of carbon, and hence diamond nucleation in the gas-phase synthesis. The purpose for using the plasma of specific gases mentioned above is to remove amorphous carbon and graphite generated while diamond nuclei are formed.

The gas-phase synthesis of diamond may be accomplished by any known technology, such as microwave CVD, high-frequency plasma CVD, hot filament CVD, DC plasma CVD, plasma jet method, combustion, and thermal CVD. In the process of gas-phase synthesis of diamond, the substrate surface takes in carbon atoms from the plasma until it is supersaturated with carbon, and then diamond nuclei begin to form. Since diamond nuclei are damaged by high energy ions from the plasma, it is necessary to generate diamond nuclei as soon as possible after the gas-phase synthesis starts. The formation of diamond nuclei is effectively accelerated by electrically biasing the substrate for a certain period of time in order to attract ions including carbon atoms and supersaturate the substrate surface with carbon. As a result, the substrate surface is exposed to plasma for a shorter period of time, and hence is less liable to be damaged by the plasma. Consequently, diamond nuclei epitaxially oriented with the substrate are formed. The bias voltage to be applied may be either positive or negative, but negative voltage has been found to be more effective.

The bias voltage application to the substrate is not mandatory; however, the gas-phase synthesis of diamond without the bias voltage application tends to result in a diamond film with poorer uniformity and smaller single crystal domains. Since prolonged exposure of platinum alloys to hydrogen plasma deteriorates them, it is desirable to use hydrogen-free gas in diamond nucleation by biasing and the gas-phase synthesis of diamond. An example of hydrogen-free gas is carbon monoxide or a mixture of carbon monoxide and carbon dioxide.

The single crystal diamond film obtained in the present invention has an advantage in that the platinum alloy film can be used as the electrode of electronic devices and sensors. For applications of optical windows and heat sinks, the substrate can be removed by mechanical and chemical methods. It is also possible to polish one side or both sides of a free-standing film.

Generally, it is possible to synthesize diamond films of about 0.1 μm to several millimeters by gas-phase synthesis. It is also possible, for example, to employ microwave CVD to synthesize a single crystal diamond film and then employ a plasma jet method or combustion method to make a thicker diamond film.

In order to synthesize p-type or n-type single crystal diamond film, the source gas is incorporated with a boron-containing gas, such as $B_2H_6$, or a phosphorus-containing gas, such as $PH_3$, in the stage of diamond nucleation and diamond growth.

In the present invention, it is possible to form a patterned single crystal diamond film selectively on the substrate. This is achieved simply by partially making the platinum alloy film with, for instance, a silicon nitride film or a silicon oxide film prior to the gas-phase synthesis of diamond film.

EXAMPLES

The invention will be described in more detail with reference to the following examples. First, the basic process for forming a diamond film as follows: As a basal substrate, single crystal strontium titanate ($SrTiO_3$) or single crystal magnesium oxide with (001) or (111) crystal plane is used. With this substrate kept at a prescribed temperature, a platinum thin film is deposited thereon by magnetron sputtering or RF sputtering, followed by annealing. After the above described surface treatment, the gas-phase synthesis of diamond is undertaken by microwave CVD, high-frequency plasma CVD, hot filament CVD, DC plasma CVD, plasma jet method, combustion, or thermal CVD.

Figure 1:
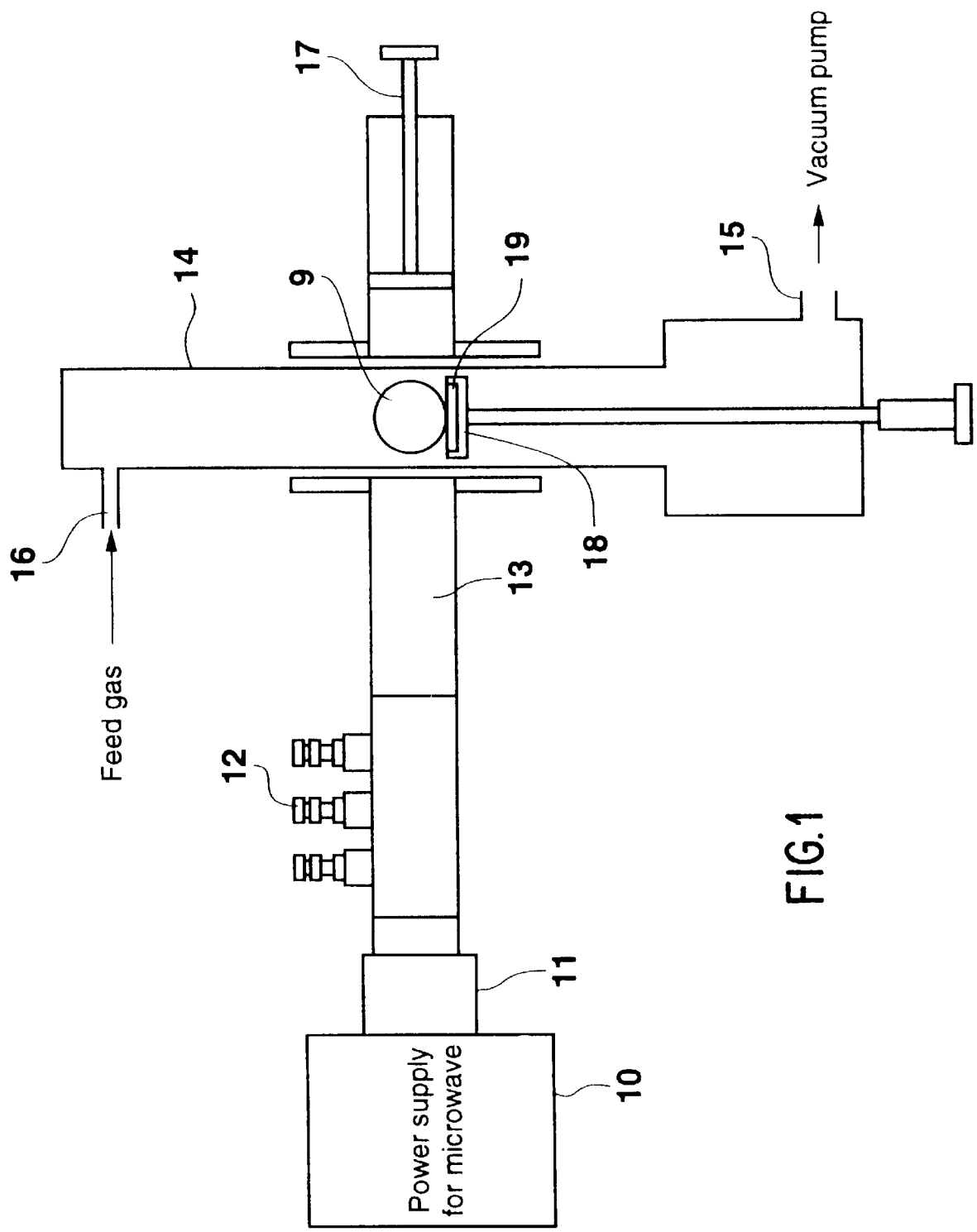
FIG. 1 is a schematic diagram showing a microwave CVD apparatus used for the gas-phase synthesis of diamond.

FIG. 1 is a schematic diagram, showing the microwave CVD apparatus used for the gas-phase synthesis of diamond in the examples. The microwave components include a microwave generator 10, an isolator 11, and a tuner 12. The microwave passes through a waveguide 13 to reach a plunger 17. A quartz tube 14 is arranged at the waveguide 13, where an inlet 16 for source gas is attached at the top of the quartz tube, and an outlet 15 at the bottom is connected to a vacuum pump. There is a substrate holder 18 at the intersection of the quartz tube 14 and the waveguide 13. The substrate 19 is placed on the substrate holder 18. The substrate holder 18 is designed in such a way that it can be transferred vertically.

In the following Examples 1, 2, 7 and 8, and 10 through 14, where diamond films were formed by using the above-mentioned apparatus, platinum was deposited on the basal substrate under the conditions given in Table 1, annealed at 1000°–1400° C. for 12 hours, and scratched by buffing with diamond powder or paste, or by ultrasonic treatment. The substrate 19 was then placed on the substrate holder 18. The quart tube 14 was evacuated by a rotary pump through the outlet 15. The source gas, listed in Table 3, was fed to the quartz tube 14 through the inlet 16 at a flow rate of 100 sccm, maintaining the pressure therein as listed in Table 3. Microwave was guided to the quartz tube 14 from the microwave generator 10 through the waveguide 13 so as to generate plasma in the quartz tube. The microwave powder and the substrate position were adjusted so that the substrate temperature was within the range given in Table 2. The substrate temperature was measured with an optical thermometer placed above the quartz tube.

Figure 2:
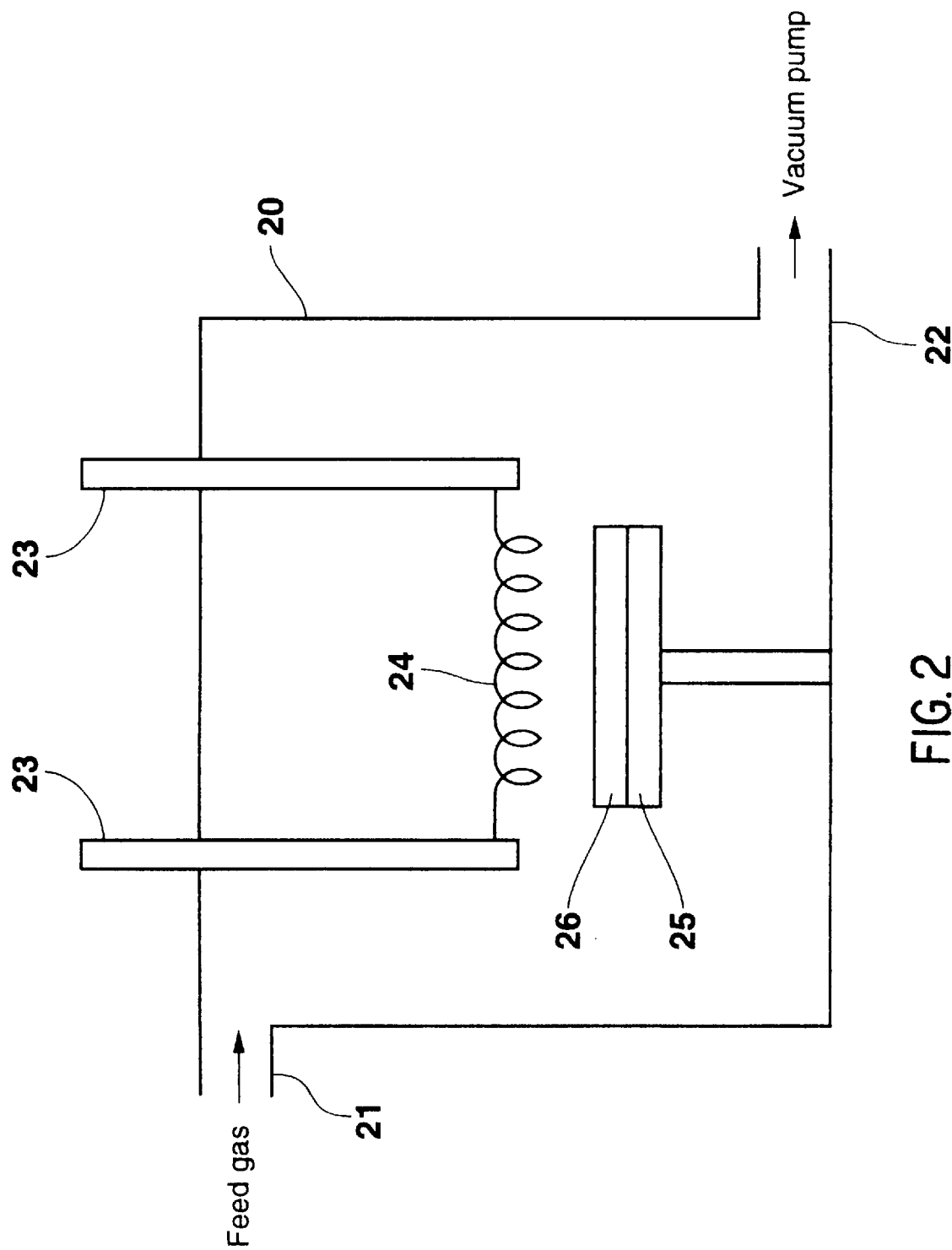
FIG. 2 is a schematic diagram showing a hot filament CVD apparatus used for the gas-phase synthesis of diamond.

FIG. 2 is a schematic diagram, showing a hot filament CVD apparatus used for the gas-phase synthesis of diamond in the examples. The apparatus has a chamber 20, which is provided with a source gas inlet 21 and a gas outlet 22 connected to a vacuum pump. The filaments 24 are connected to a power supply 23. A substrate 26 is placed on a substrate holder 25 with a built-in heater (not shown).

In Examples 3, 4, and 9, where diamond films were formed using the above-mentioned apparatus, platinum was deposited on the basal substrate under the conditions listed in Table 1, as in the case of the microwave CVD synthesis, annealed at 1000°–1400° C. for 12 hours, and the surface treatment conducted. The surface treatment in Examples 3 and 9 was by buffing or ultrasonic treatment, as in the case of the above-mentioned examples. The surface treatment in Example 4 was by carbon ion implantation at a density of $10^{16}/cm^2$ at 60 keV onto the platinum surface. The resulting substrate 26 was placed on the substrate holder 25. The chamber 20 was fed with a source gas, as listed in Table 3, through the inlet 21 at a flow rate of 100 sccm, with the pressure therein kept as listed in Table 3. The hot filament 24, which is 8 mm above the substrate 26, was heated to 2200° C. During the gas-phase synthesis of the diamond film, the substrate heater was controlled such that the substrate temperature was kept at 800°–950° C. for 30–60 minutes, at 1300°–1400° C. for 1–5 minutes, and again at 800°–950° C. in Examples 3 and 4. The substrate temperature was kept at 780°–860° C. in Example 9.

In Example 5, the gas-phase synthesis of diamond film was carried out by the DC plasma jet CVD method under the conditions listed in Tables 1 to 3.

In Example 6, platinum was deposited on the basal substrate under the conditions listed in Table 1, annealed at 1000°–1400° C. for 12 hours, and the surface treatment was done by buffing or ultrasonic treatment in the same manner as mentioned before. The substrate was set on a substrate holder, which was positioned such that the substrate was 10 mm away from a welding burner, fed with acetylene-oxygen mixture at a flow rate of 2 liters per minute, and exposed to the inner flame of a 25-cm-long combustion flame. The diamond film synthesis was carried out under the conditions listed in Tables 2 and 3.

The deposited platinum film in Examples 1, 11 through 14 was examined by X-ray diffraction and reflection modes. The orientations of the diamond films obtained in Examples 1 through 14 were examined. The results are shown in Tables 2 and 4.

TABLE 1

| | Conditions of platinum deposition | | | | |
|---|---|---|---|---|---|
| Example No. | Substrate | Surface | Substrate temperature | Film thickness | Surface treatment |
| 1 | $SrTiO_3$ | (111) | 300–500° C. | 8 μm | scratching |
| 2 | $SrTiO_3$ | (001) | 300–500° C. | 8 μm | scratching |
| 3 | $SrTiO_3$ | (111) | 300–500° C. | 8 μm | scratching |
| 4 | $SrTiO_3$ | (111) | 300–500° C. | 8 μm | carbon ion implantation |
| 5 | $SrTiO_3$ | (111) | 300–500° C. | 8 μm | scratching |
| 6 | $SrTiO_3$ | (001) | 300–500° C. | 8 μm | scratching |
| 7 | $SrTiO_3$ | (111) | 300–500° C. | 8 μm | scratching |
| 8 | $SrTiO_3$ | (001) | 300–500° C. | 8 μm | scratching |
| 9 | $SrTiO_3$ | (001) | 300–500° C. | 8 μm | scratching |
| 10 | $SrTiO_3$ | (001) | 300–500° C. | 8 μm | scratching |
| 11 | $SrTiO_3$ | (111) | 350–500° C. | 10 μm | scratching |
| 12 | $SrTiO_3$ | (001) | 500–800° C. | 6 μm | scratching |
| 13 | MgO | (111) | 500–800° C. | 10 μm | scratching |
| 14 | MgO | (001) | 300–800° C. | 6 μm | scratching |

TABLE 2

| Example No. | Surface morphology of platinum film | Conditions of gas-phase synthesis of diamond | |
|---|---|---|---|
| | | Method | Substrate temperature |
| 1 | (111) microcrystalline | microwave CVD | 800–890° C. |
| 2 | (111) microcrystalline | microwave CVD | 700–850° C. |
| 3 | (111) microcrystalline | hot filament CVD | 800–950° C. |
| 4 | (111) microcrystalline | hot filament CVD | 800–950° C. |
| 5 | (111) microcrystalline | DC plasma jet CVD | 850° C. |
| 6 | (111) microcrystalline | combustion | 850–890° C. |
| 7 | (111) microcrystalline | microwave CVD | 900–930° C. |
| 8 | (111) microcrystalline | microwave CVD | 750–800° C. |
| 9 | (111) microcrystalline | hot filament CVD | 780–860° C. |
| 10 | (111) microcrystalline | microwave CVD | 750–800° C. |
| 11 | (111) microcrystalline | microwave CVD | 800–890° C. |
| 12 | (001) polycrystalline | microwave CVD | 700–850° C. |
| 13 | (111) microcrystalline | microwave CVD | 800–890° C. |
| 14 | (001) polycrystalline | microwave CVD | 700–850° C. |

TABLE 3

| | Conditions of gas-phase synthesis of diamond | |
|---|---|---|
| Example No. | Source gas | Pressure |
| 1 | methane 0.2–0.8%, hydrogen | 30–60 Torr |
| 2 | methane 0.8–7.0%, hydrogen | 30–60 Torr |
| 3 | methane 0.2–0.8%, hydrogen | 30–60 Torr |
| 4 | methane 0.2–0.8%, hydrogen | 30–60 Torr |
| 5 | methane 1.0%, hydrogen | 60 Torr |
| 6 | atmosphere | 760 Torr |
| 7 | carbon monoxide 2.0%, hydrogen | 30–60 Torr |
| 8 | methane 5.0%, oxygen 1.0%, hydrogen | 30–60 Torr |
| 9 | methane 3.0%, steam 1.0%, hydrogen | 30–60 Torr |
| 10 | ethyl alcohol 1.0%, hydrogen | 50 Torr |
| 11 | methane 0.2–0.8%, hydrogen | 30–60 Torr |
| 12 | methane 0.8–7.0%, hydrogen | 30–60 Torr |
| 13 | methane 0.2–0.8%, hydrogen | 30–60 Torr |
| 14 | methane 0.8–7.0%, hydrogen | 30–60 Torr |

TABLE 4

| Example No. | Time required for diamond to nucleate | Time required for diamond to coalesce | Orientation Crystal plane | Diamond film |
|---|---|---|---|---|
| 1 | 5 hours | 26 hours | (111) | single crystal |
| 2 | 4 hours | 10 hours | (001) | single crystal |
| 3 | 4 hours | 20 hours | (111) | single crystal |
| 4 | 4 hours | 20 hours | (111) | single crystal |
| 5 | 1 hour | 4 hours | (111) | single crystal |
| 6 | 0.5 hours | 0.5 hours | (001) | single crystal |
| 7 | 3 hours | 15 hours | (111) | single crystal |
| 8 | 3 hours | 15 hours | (001) | single crystal |
| 9 | 3 hours | 12 hours | (001) | single crystal |
| 10 | 5 hours | 25 hours | (001) | single crystal |
| 11 | 5 hours | 25 hours | (111) | single crystal |
| 12 | 5 hours | 25 hours | (001) | single crystal |
| 13 | 5 hours | 25 hours | (111) | single crystal |
| 14 | 5 hours | 25 hours | (001) | single crystal |

Examinations by X-ray diffraction and reflection modes indicate, as shown in Table 2, that the platinum film is epitaxial with the basal substrate, and the morphology is either microcrystalline or polycrystalline with the same crystal orientation as the basal substrate.

In Example 1, partially oriented diamond particles appear after 5 hours, and adjacent particles coalesced after 26 hours.

Figure 3:
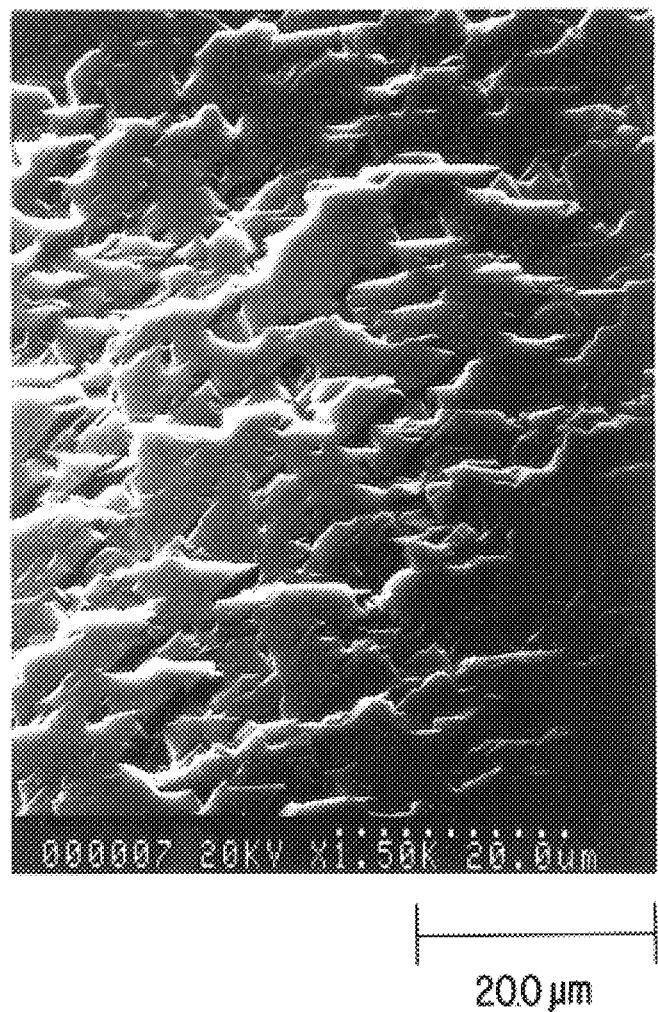
FIG. 3 is an electron micrograph showing a stage in which single crystal diamond film is growing.

FIG. 3 is an electron micrograph, showing an intermediate stage of diamond film growing to be a single crystal. It is seen that the (111) crystal planes of diamond are coalesced with each other to form a continuous single crystal film.

Similarly in Examples 2 through 10, diamond particles appeared, and then coalesced, as shown in Table 4. In Examples 1 though 14 single crystal diamond films were grown epitaxially to the crystal plane of the substrate.

Although the platinum film deposited on strontium titanate was not a single crystal, it was found that if the substrate temperature was below 500° C., a better orientation was obtained after the substrate was annealed above 800° C., preferably above 1400° C., for more than 10 hours. A single crystal diamond film was obtained using the annealed platinum/strontium titanate as the substrate.

In order to examine the effects of the basal substrate material on the surface morphology of platinum film, platinum films were deposited on various basal substrate materials and investigated by X-ray diffraction and reflection modes. For the basal substrate material, lithium fluoride, calcium fluoride, magnesium oxide, nickel oxide, zirconium oxide, aluminum oxide (sapphire), strontium titanate, barium titanate, lead titanate, potassium tantalate, lithium niobate, silicon, quartz, and glass were used. It was found that, in all cases, the deposited platinum film had a (111) crystal surface and the diamond films formed thereon by gas-phase synthesis were single crystal.

In order to examine the effects of the annealing temperature on the surface morphology of platinum film, platinum films were annealed at different temperatures, and investigated by means of X-ray diffraction. The annealing temperature was changed from 100° to 1500° C. at increments of 100° C. It was found that a better orientation was obtained, if the substrate was annealed at temperatures above 300° C., and the best result was obtained when the annealing temperature was between 1000° and 1400° C. Single crystal diamond films were grown over a large area of these substrates.

Furthermore, in order to investigate the effects of gas environment in annealing on the surface morphology of platinum film, platinum films were annealed in various enviroments. The annealing temperature was 1000° C., the time was 20 hours, and the environment was as given in Table 5. Table 5 also includes the results.

TABLE 5

| Example No. | Gas atmosphere | Results |
|---|---|---|
| 21 | Inert gas | good |
| 22 | Hydrogen | poor |
| 23 | Oxygen + hydrogen | good |
| 24 | Inert gas + oxygen | good |
| 25 | Inert gas + hydrogen | poor |

As seen in Table 5, the orientation of platinum film was good in Example 21, 23, and 24, whereas the surface of platinum films were so rough in Examples 22 and 25 that it was not possible to form a single crystal diamond film by gas-phase synthesis. These results indicate that the reducing atmosphere is not suitable for annealing the substrate, and it is necessary to use the inert gas atmosphere or the oxidizing gas atmosphere for annealing.

Figure 4:
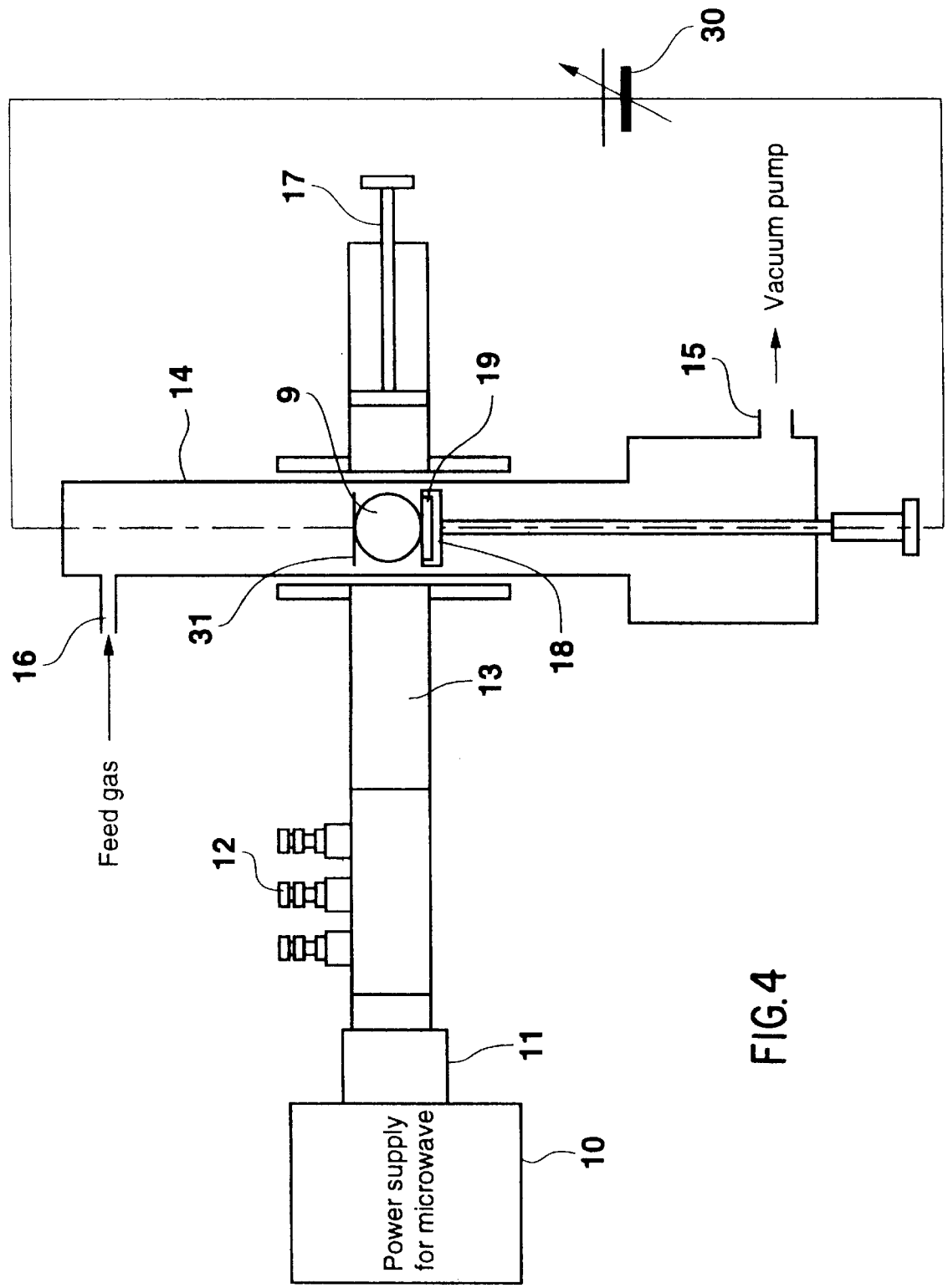
FIG. 4 is a schematic diagram showing a microwave CVD apparatus of quartz tube type, capable of biasing.
Figure 5:
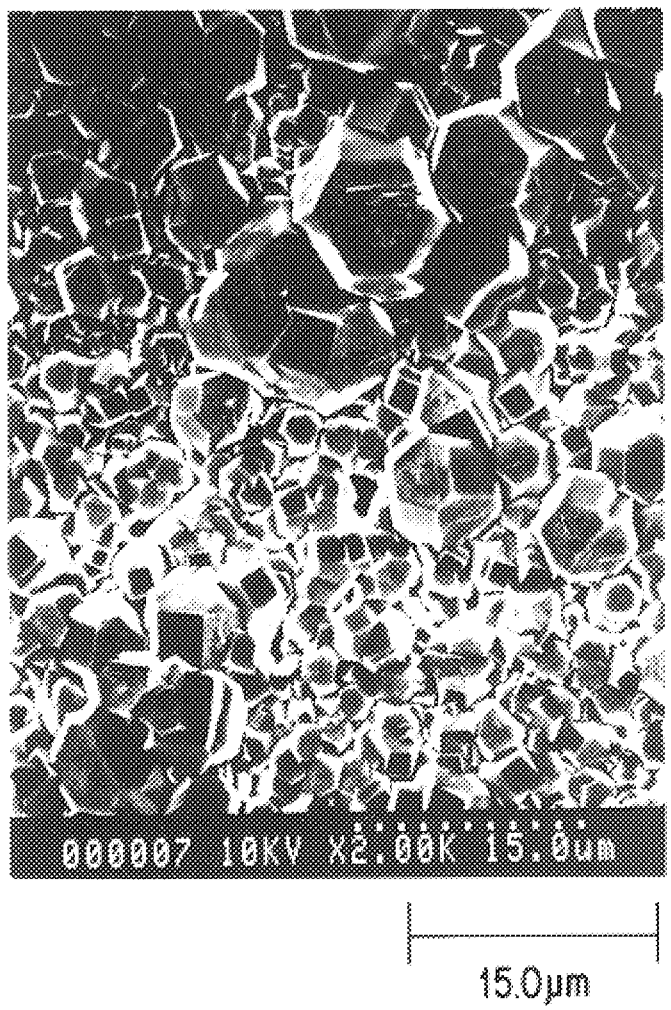
FIG. 5 is an electron micrograph showing a polycrystalline diamond film.
Figure 6:
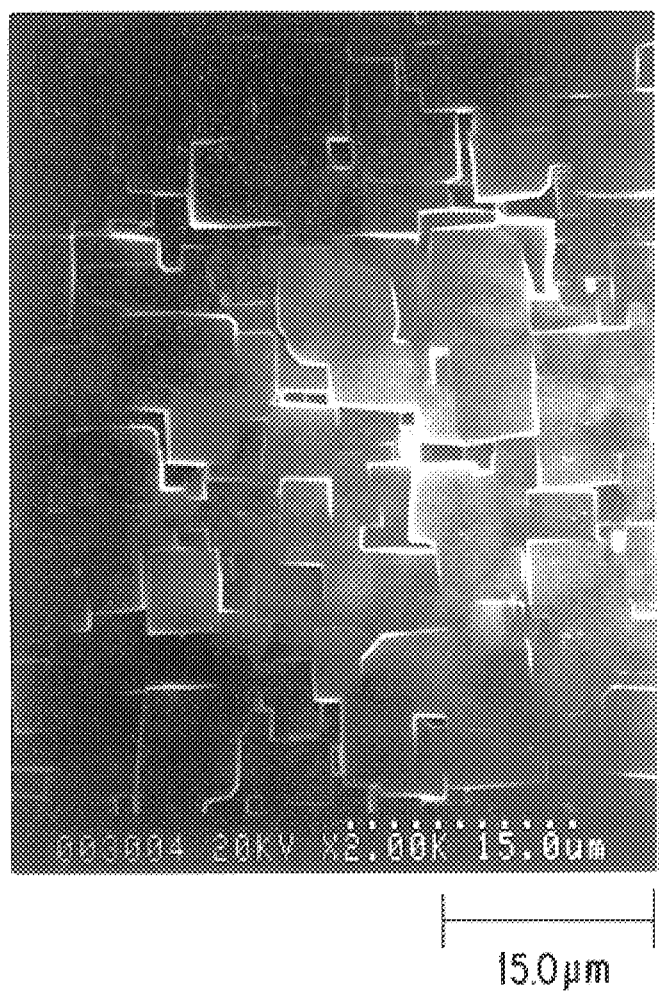
FIG. 6 is an electron micrograph showing a highly oriented diamond film in which diamond particles are almost uniformly oriented.

In Example 30, diamond film was grown under the conditions shown in Table 6 using a quartz tube-type microwave CVD apparatus in which bias voltage was applied to the substrate, and its crystal structure was examined. The apparatus used is schematically shown in FIG. 4. This apparatus differs from that shown in FIG. 1 in that an opposed electrode 31 is installed above a substrate holder 18 in the quartz tube 14, and DC voltage from a DC power supply 30 is applied across the opposed electrode 31

(positive) and the substrate holder 18 (negative). The substrate was strontium titanate with a (001) or (111) crystal surface, platinum was deposited thereon, and annealing was carried out in the same manner as in Example 1.

TABLE 6

|  | Before voltage application | At bias voltage application | After bias voltage application |
|---|---|---|---|
| Reaction gas | $CH_4/H_2$ = 0.1–10% | $CH_4/H_2$ = 0.1–10% | $CH_4/H_2$ = 0.5–15% $O_2$ = 0.1–7% |
| Gas flow rate | 50–300 sccm | 50–300 sccm | 50–300 sccm |
| Substrate temperature | 600–1100° C. | 400–1100° C. | 750–950° C. |
| Gas pressure | 10–50 Torr | 1–100 Torr | 20–100 Torr |
| Other conditions | Duration of plasma treatment: 30–120 min | Applied voltage: −70 to −350 V DC, or +70 to +350 V DC Duration of voltage application: 1–90 min | Growth time: 3–40 hours |

As a result of the gas-phase synthesis under the conditions shown in Table 6, a single crystal diamond film with a thickness of about 10–50 μm and a (001) or (111) surface was formed. However, only polycrystalline diamond films were grown when the gas-phase synthesis was conducted under conditions outside those given in Table 6.

In Example 31, a diamond film was formed under the conditions shown in Table 7 using the same substrate and the CVD apparatus as used in Example 30, but using a source gas not containing hydrogen.

TABLE 7

|  | Before bias voltage application | At bias voltage application | After bias voltage application |
|---|---|---|---|
| Reaction gas | $CO/CO_2$ | $CO/CO_2$ | $CO/CO_2$ |
| Gas flow rate | 50–300 sccm | 50–300 sccm | 50–300 sccm |
| Substrate temperature | 700–1200° C. | 400–1100° C. | 800–950° C. |
| Gas pressure | 10–50 Torr | 1–100 Torr | 20–100 Torr |
| Other conditions | Duration of plasma treatment: 30–120 min | Applied voltage: −70 to −350 V DC, or +70 to +350 V DC Duration of voltage application: 1–90 min | Growth time: 3–40 hours |

As a result, a single crystal diamond film of about 10–50 μm in thickness with a (001) or (111) surface was obtained.

In the last example, diamond films were formed on platinum alloy films composed of 90 atomic % of platinum and 10 atomic % of gold and about 10 μm in thinness, that were formed by sputtering strontium titanate with a (111) crystal plane. The film was annealed in an atmosphere of 1200° C. for 24 hours. A gas-phase synthesis was carried out in the same manner as in Example 1, resulting in the formation of a single crystal diamond film with a (111) surface. Similar results were obtained when silver and cooper were used instead of gold.

[Effect of the invention]

According to the present invention, the gas-phase synthesis of a single crystal diamond film is performed on a platinum film or platinum alloy films containing more than 50 atomic % of platinum, which have been deposited on specific substrates having a (111) or (001) crystal plane and annealed under specific conditions. This process makes it possible to form a single crystal diamond film on a large area. Such diamond films are used in a broad range of applications, and thus, the present invention greatly contributes to a number of industrial fields.

What is claimed is:

1. A process of forming a single crystal diamond film comprising:

depositing a platinum film or a platinum alloy film containing more than 50 atomic % of platinum on a basal substrate, annealing the film, and depositing a single crystal diamond film by gas-phase synthesis on the platinum film or the platinum alloy film as the substrate.

2. A process of forming a single crystal diamond film according to claim 1, which further comprises a step of surface treatment of the platinum or platinum alloy film after annealing and before the gas-phase synthesis of diamond film.

3. A process of forming a single crystal diamond film according to claim 2, wherein the surface treatment is scratching by buffing with a diamond powder or paste, or scratching by ultrasonic means, or carbon ion implantation.

4. A process of forming a single crystal diamond film according to any of claims 1 to 3, wherein said basal substrate has either a (111) or a (001) surface, and the material is selected from the group consisting of lithium fluoride, calcium fluoride, magnesium oxide, nickel oxide, zirconium oxide, aluminum oxide, strontium titanate, barium titanate, lead titanate, potassium tantalate, and lithium niobate.

5. A process of forming a single crystal diamond film according to any of claims 1 to 3, wherein said basal substrate material is selected from a group consisting of silicon, quartz, and glass.

6. A process for forming single crystal diamond film according to claim 1, wherein said platinum or platinum alloy film has either a (111) or a (001) surface which is epitaxially oriented with respect to the substrate.

7. A process of forming a single crystal diamond film according to claim 1, wherein said platinum or platinum alloy film is microcrystalline or polycrystalline.

8. A process of forming a single crystal diamond film according to claim 1, wherein the deposition of said platinum or platinum alloy film is carried out by keeping the substrate temperature at 300° C. or above.

9. A process of forming a single crystal diamond film according to claim 1, where said platinum alloy contains at least one element selected from groups 6A, 7A, 8A, and 1B of the periodic table.

10. A process of forming a single crystal diamond film according to claim 1, wherein said annealing is carried out at 1000° C. or above.

11. A process of forming a single crystal diamond film according to claim 1, wherein said annealing is carried out in an oxidizing atmosphere.

12. A process of forming a single crystal diamond film according to claim 1, wherein the gas-phase synthesis of a diamond film is preceded by the application of a bias voltage to said substrate for formation of diamond nuclei on the substrate.

13. A process of forming a single crystal diamond film according to claim 1, wherein the gas-phase synthesis of a diamond film employs a hydrogen-free gas.

14. A process of forming a single crystal diamond film according to claim 1, wherein the formation of diamond nuclei employs a hydrogen-free gas.

* * * * *

UNITED STATES PATENT AND TRADEMARK OFFICE
CERTIFICATE OF CORRECTION

PATENT NO. : 5,363,824
DATED : January 26, 1999
INVENTOR(S) : Gardner et al.

It is certified that error appears in the above-identified patent and that said Letters Patent is hereby corrected as shown below:

The title should read "METHOD OF FORMING SEMICONDUCTOR DEVICES USING GATE ELECTRODE LENGTH AND SPACER WIDTH FOR CONTROLLING DRIVE CURRENT STRENGTH"

In the heading, the name of the second-named inventor should be "H. Jim Fulford"

Signed and Sealed this

First Day of May, 2001

Attest:

NICHOLAS P. GODICI

Attesting Officer    Acting Director of the United States Patent and Trademark Office